(12) United States Patent
Oguri

(10) Patent No.: US 8,253,226 B2
(45) Date of Patent: Aug. 28, 2012

(54) ELECTRONIC PARTS, AND METHOD FOR ARRANGING SHIELDING CASE AND CHIP PARTS

(75) Inventor: Shinji Oguri, Saitama (JP)

(73) Assignee: NEC Corporation, Tokyo (JP)

( * ) Notice: Subject to any disclaimer, the term of this patent is extended or adjusted under 35 U.S.C. 154(b) by 320 days.

(21) Appl. No.: 12/738,603

(22) PCT Filed: Oct. 3, 2008

(86) PCT No.: PCT/JP2008/002793
§ 371 (c)(1),
(2), (4) Date: Apr. 16, 2010

(87) PCT Pub. No.: WO2009/050853
PCT Pub. Date: Apr. 23, 2009

(65) Prior Publication Data
US 2010/0213583 A1    Aug. 26, 2010

(30) Foreign Application Priority Data
Oct. 18, 2007 (JP) .................................. 2007-270798

(51) Int. Cl.
H01L 23/04 (2006.01)
H01L 23/10 (2006.01)
H01L 23/14 (2006.01)
H01L 21/64 (2006.01)
H01L 21/98 (2006.01)

(52) U.S. Cl. ........ 257/680; 257/691; 257/692; 257/725; 438/117; 438/121

(58) Field of Classification Search ........................ None
See application file for complete search history.

(56) References Cited

FOREIGN PATENT DOCUMENTS

| JP | 2000-106475 A | 4/2000 |
|----|---------------|--------|
| JP | 2001-244688 A | 9/2001 |
| JP | 2001-274590 A | 10/2001 |
| JP | 2001274590 A * | 10/2001 |
| JP | 2002-064295 A | 2/2002 |

(Continued)

OTHER PUBLICATIONS

International Search Report for PCT/JP2008/002793, mailed Nov. 11, 2008.

*Primary Examiner* — Joseph Schoenholtz

(57) ABSTRACT

An electronic part (100) that shields parts on a substrate (101) includes a plurality of chip parts (102) each having on a respective end portion a ground terminal (103A) and an electrode terminal (103B) that supplies a voltage source, and located at regular intervals on the substrate with the respective ground terminals aligned, the ground terminal and the electrode terminal being electrically connected to a ground terminal land (107A) and an electrode terminal land (107B) of the substrate respectively; and a shielding case (104) that shields the plurality of chip parts and includes an opening (105) through which a resin is to be provided for securing strength of the respective electrical connection points of the ground terminal land and the electrode terminal land of the substrate with the ground terminal and the electrode terminal of the chip parts; the opening being formed such that an edge (106) of the opening becomes parallel to the ground terminal of the respective chip parts, and such that upon being warped the opening edge and the ground terminal of the respective chip parts contact each other, and such that upon being a portion of said chip parts other than a grounding part opposes the opening without contacting the edge of the opening.

8 Claims, 9 Drawing Sheets

FOREIGN PATENT DOCUMENTS

| | | | |
|---|---|---|---|
| JP | 2002064295 A | * | 2/2002 |
| JP | 2003-115564 A | | 4/2003 |
| JP | 3111672 A | | 6/2005 |
| WO | 2005/101931 A | | 10/2005 |
| WO | WO 2005101931 A1 | * | 10/2005 |

* cited by examiner

BENDING FORCE

FIG. 3
(a)
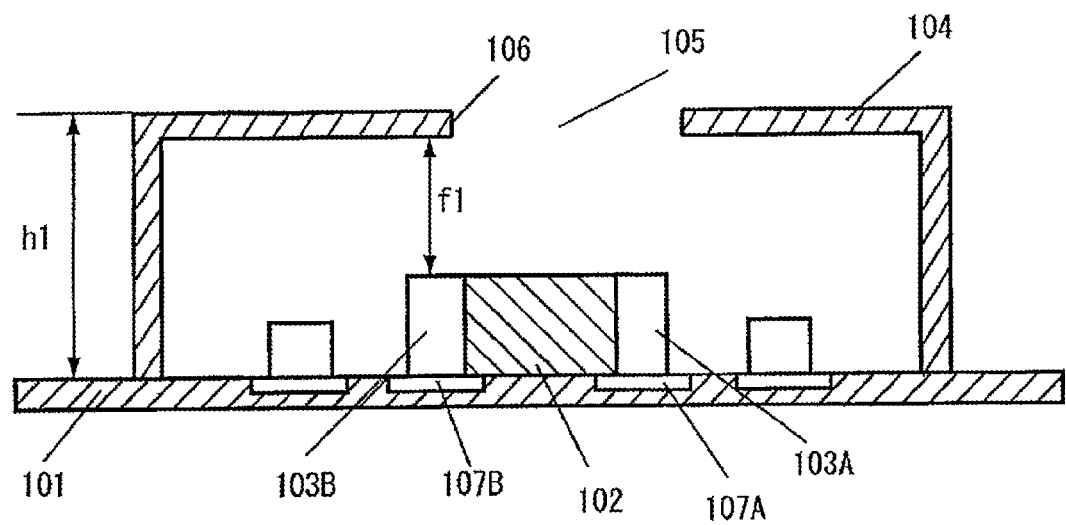
(b)
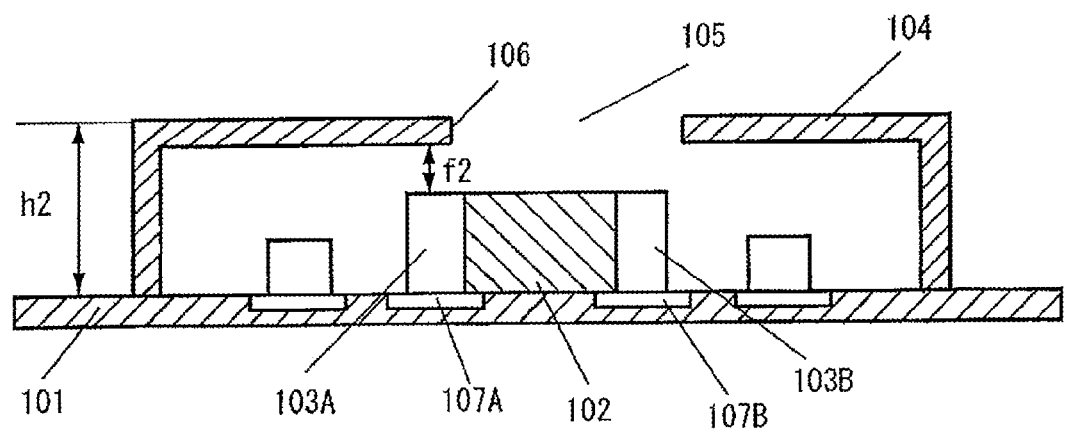

FIG. 4
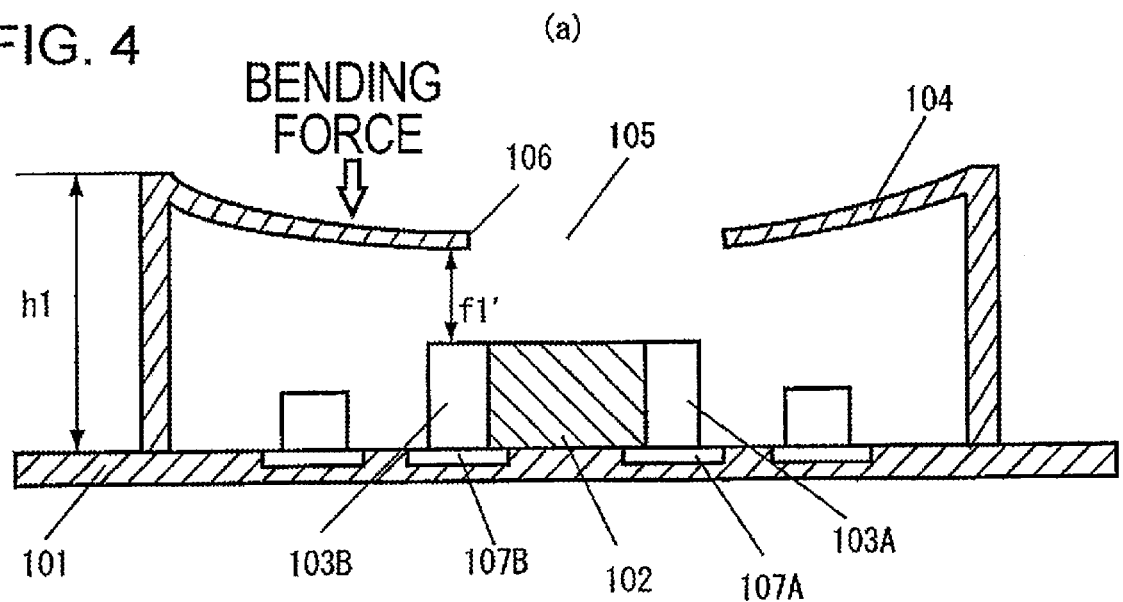
(a)
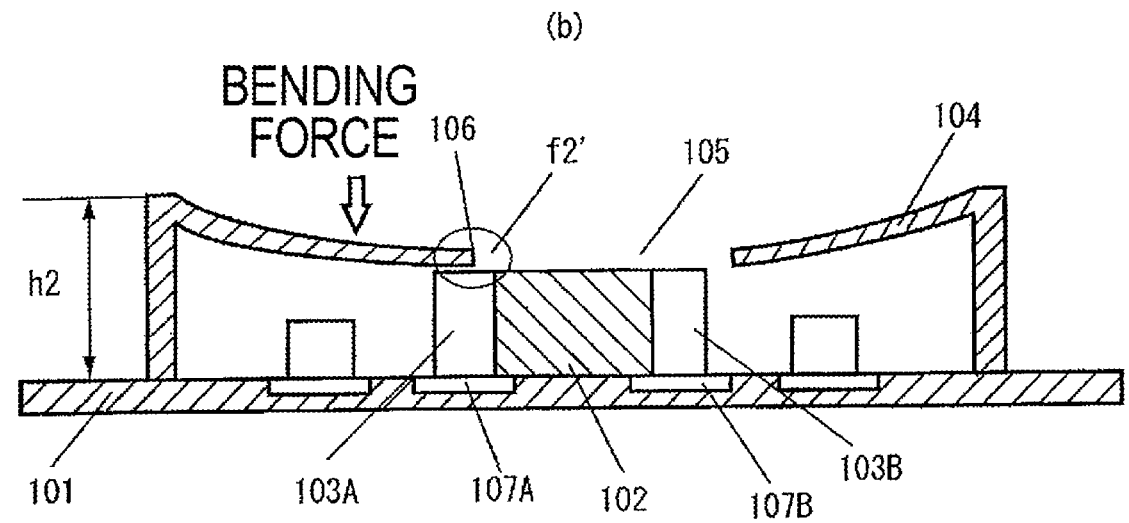
(b)

FIG. 5
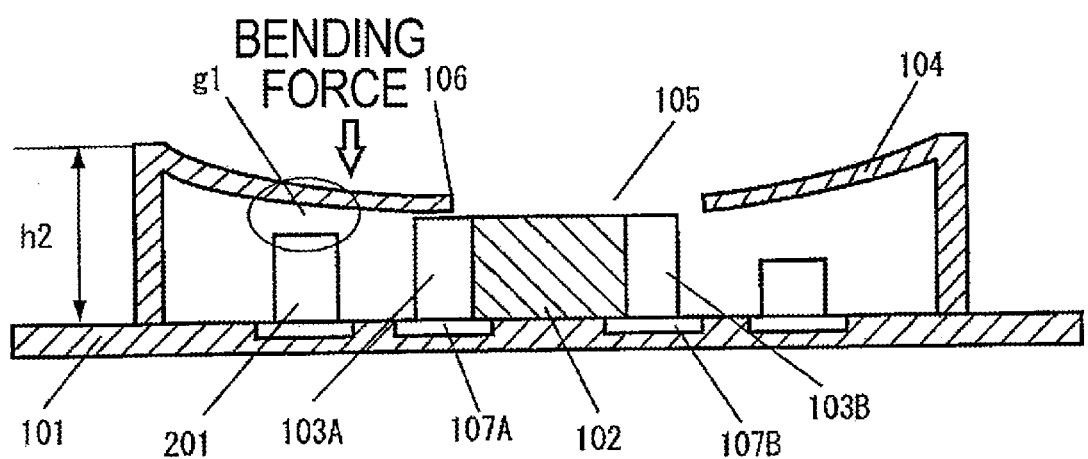
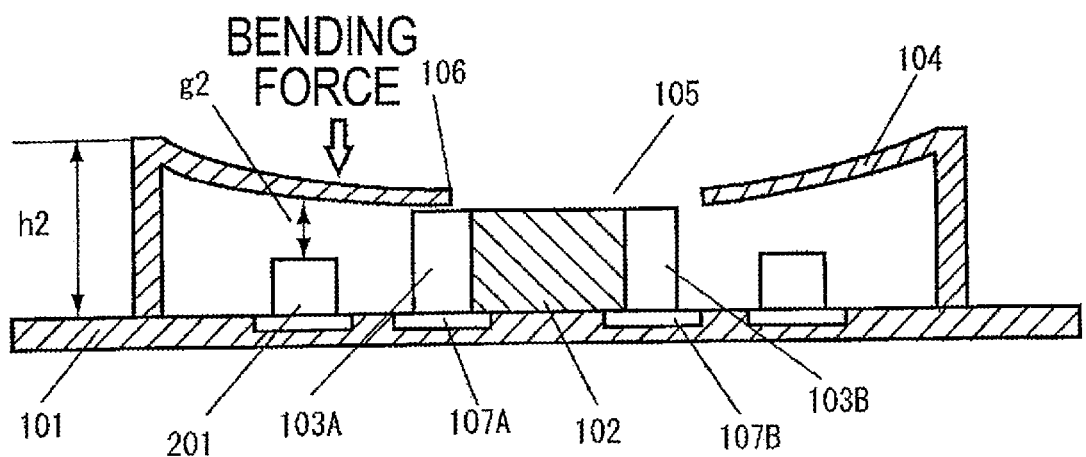

ptinstart
ELECTRONIC PARTS, AND METHOD FOR ARRANGING SHIELDING CASE AND CHIP PARTS This application is the National Phase of PCT/JP2008/002793, filed on Oct. 3, 2008 which claims priority based on Japanese patent application No. 2007-270798 filed on Oct. 18, 2007, the content of which is incorporated hereinto by reference in its entirety.

TECHNICAL FIELD

The present invention relates to an electronic part including chip parts shielded in a shielding case. More particularly, the present invention relates to an electronic part in which the shielding case is encapsulated with a resin through an opening on a top face thereof for securing drop strength of a terminal portion of the chip parts, with minimized clearance between the shielding case and the chip parts, and to a method for arranging the shielding case and the chip parts to form such electronic part.

BACKGROUND ART

On an electronic part, generally, chip parts including a semiconductor IC and so forth are enclosed in a shielding case, for assuring electromagnetic compatibility (EMC). Also, in order to avoid short circuit caused by contact of the shielding case and a power source of the chip parts in the shielding case, the shielding case is made sufficiently high to thereby secure a clearance between the shielding case and the chip parts.

Recently, it is becoming more difficult to secure the clearance between the shielding case and the chip parts enclosed therein, under the restriction imposed by requirement for reducing the thickness of a device in which the electronic part is to be implemented.

In particular, the shielding case is often encapsulated with a resin through an opening provided on a top face of the shielding case, to secure drop strength of a terminal portion of the chip parts in the shielding case. With such structure, in the case where bending force is applied from outside to the top face of the shielding case, stress is concentrated at the opening on the top face of the shielding to thereby warp the edge of the opening, which may bring the shielding case and the chip parts in the shielding case into contact and thus causing short circuit and resultant malfunctions such as erroneous action and abnormal heat generation.

Accordingly, in order to avoid short circuit caused by contact of the shielding case and the chip parts in the shielding case, the shielding case is made sufficiently high to thereby secure a clearance between the shielding case and the chip parts, which, prevent reducing the thickness of the device.

Regarding such problem, the following related arts can be found.

One is a high-frequency electronic part having increased strength while maintaining shielding performance of an outer case, which includes a substrate, surface-mounted parts, and the outer case; and the surface-mounted parts include a first terminal electrode and a second terminal power source provided for inputting/outputting a high-frequency signal or applying a source voltage; the surface-mounted parts have a surface opposing the outer case formed in a flat plane; the first terminal electrode includes a first folded portion formed on a surface opposing the outer case; the second terminal electrode includes second folded portion formed on a surface opposing the outer case; and the outer case includes a first opening formed so as to expose the first folded portion, a second opening formed so as to expose the second folded portion, and an intermediate portion between the first opening and the second opening (for example, refer to the patent document 1).

An object of the foregoing patent document is to keep the outer case and the electrodes from contacting each other by forming the openings on the outer case, thereby reducing the distance between the outer case and the surface-mounted parts and thus reducing the height of the electronic part. However, since the openings are made small from the viewpoint of strength of the outer case, shielding effect against electromagnetic interference, and intrusion of a foreign substance, such openings are inappropriate for providing the resin therethrough, for securing the drop strength of the terminal portion of the chip parts as stated above.

Another one is a circuit substrate device that simplifies a bonding process of the shielding case and reducing the size thereof, in which electronic parts are mounted along a periphery of a substrate with the respective terminal electrodes of ground potential facing the periphery of the substrate, and the inner wall of the shielding case is brought into contact with the terminal electrodes of ground potential of the electronic parts and conductively bonded therewith (for example, refer to the patent document 2).

The object of the patent document 2 is to simplify the bonding process of the shielding case and reducing the size thereof, by bringing the inner wall of the shielding case into contact with the terminal electrodes of ground potential of the electronic parts and conductively bonding. However, such technique is not intended for minimizing the distance between the shielding case and the chip parts thereby reducing the thickness of the device, in the electronic part encapsulated with the resin for securing the drop strength of the terminal portion of the chip parts, as stated above.

[Patent document 1] JP-UM No. 3111672
[Patent document 2] JP-A No. 2000-106475

DISCLOSURE OF THE INVENTION

Accordingly, in view of the foregoing problem, an object of the present invention is to provide an electronic part, in which an opening is provided on a top face of a shielding case, having minimized clearance between the shielding case and chip parts so as to reduce the thickness of a device, and a method for arranging the shielding case and the chip parts to form such electronic part.

According to the present invention, there is provided an electronic part that includes parts shielded on a substrate, comprising a plurality of chip parts each having on a respective end portion a ground terminal and an electrode terminal that supplies a voltage source, and located at regular intervals on the substrate with the respective ground terminals aligned, the ground terminal and the electrode terminal being electrically connected to a ground terminal land and an electrode terminal land of the substrate respectively; and a shielding case that shields the plurality of chip parts and includes an opening through which a resin is to be provided for securing strength of the respective electrical connection points of the ground terminal land and the electrode terminal land of the substrate with the ground terminal and the electrode terminal of the chip parts; the opening being formed such that an edge of the opening becomes parallel to the ground terminal of the respective chip parts, and such that upon being warped the opening edge and the ground terminal of the respective chip parts contact each other, and such that upon being warped a portion of the chip parts other than a grounding part opposes the opening without contacting the edge of the opening.

Also, around the respective chip parts, peripheral parts lower in height than the chip parts are located.

In the case where the opening is formed in a rectangular shape, chip parts is located such that the ground terminals are linearly aligned along the opening edge that constitutes one side of the rectangle.

Further, the plurality of chip parts is located such that the plurality of ground terminals is linearly aligned along the opening edge opposing the one side of the rectangle.

Further, the plurality of chip parts is located such that the plurality of ground terminals is linearly aligned along a side orthogonal to the opening edge constituting the one side of the rectangle.

Further, the opening edge constituting the one side of the rectangle may be formed in a stepped shape, and the plurality of chip parts may be located such that the plurality of ground terminals is linearly aligned along a respective side of the stepped portion.

Still further, in the case where the plurality of chip parts is separated in a plurality of groups on the substrate, the shielding case may include a plurality of openings, and the openings may be formed such that an edge of each opening becomes parallel to the ground terminals of the plurality of chip parts of each group.

According to the present invention, there is provided also a method for arranging a shielding case and a plurality of chip parts, comprising locating at regular intervals on a substrate the plurality of chip parts each having on a respective end portion a ground terminal and an electrode terminal that supplies a voltage source, such that the respective ground terminals are aligned, and electrically connecting the ground terminal and the electrode terminal to a ground terminal land and an electrode terminal land of the substrate respectively; forming an opening on the shielding case through which a resin is to be provided for securing strength of the respective electrical connection points of the ground terminal land and the electrode terminal land of the substrate with the ground terminal and the electrode terminal of the chip parts; and forming an opening edge such that an edge of the opening becomes parallel to the ground terminal of the respective chip parts, and such that upon being warped the opening edge and the ground terminal of the respective chip parts contact each other, and such that upon being warped a portion of the chip parts other than a grounding part opposes the opening without contacting the edge of the opening.

As described above, the present invention includes locating at regular intervals on a substrate the plurality of chip parts each having on a respective end portion a ground terminal and an electrode terminal that supplies a voltage source, such that the respective ground terminals are aligned, and electrically connecting the ground terminal and the electrode terminal to a ground terminal land and an electrode terminal land of the substrate respectively; forming an opening on the shielding case through which a resin is to be provided for securing strength of the respective electrical connection points of the ground terminal land and the electrode terminal land of the substrate with the ground terminal and the electrode terminal of the chip parts; and forming the opening such that an edge of the opening becomes parallel to the ground terminal of the respective chip parts, and such that upon being warped the opening edge and the ground terminal of the respective chip parts contact each other, and such that upon being warped a portion of the chip parts other than a grounding part opposes the opening without contacting the edge of the opening, and therefore enables minimizing a clearance between the shielding case and chip parts so as to reduce the thickness of a device, in the case where an opening is provided on a top face of a shielding case for providing a resin therethrough to thereby secure strength of the terminal portion of the chip parts.

The present invention also enables further reducing the risk that the shielding case contacts the peripheral parts.

Further, the present invention allows securing diversity in arranging the layout of the plurality of chip parts, in the case where the ground terminals of the plurality of chip parts cannot be linearly aligned.

BRIEF DESCRIPTION OF THE DRAWINGS

The above and other objects, features and advantages will become more apparent through preferred embodiments described below and the following accompanying drawings.

FIGS. 3(a) and 3(b) are side views of an electronic part 100 shown in FIG. 1, for explaining comparison of the height of the electronic part 100;

FIGS. 4(a) and 4(b) are side views of the electronic part 100 with an opening edge 106 shown in FIG. 3 warped;

FIGS. 5(a) and 5(b) are side views of the electronic part 100, for explaining comparison of the height of the chip parts 102 and peripheral parts shown in FIG. 1;

BEST MODE FOR CARRYING OUT THE INVENTION

Figure 1:
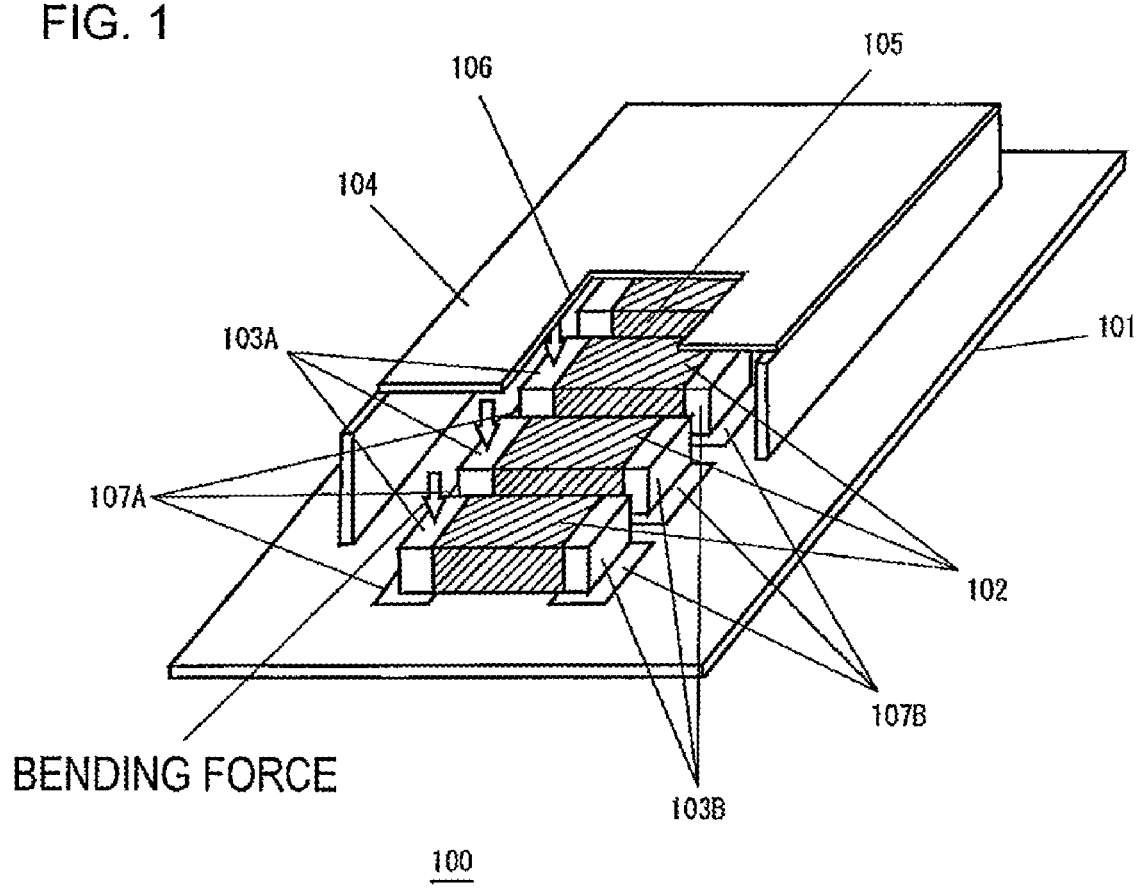
FIG. 1 is a perspective view schematically showing an appearance of an electronic part according to the present invention.

Hereunder, embodiments of the present invention will be described referring to the drawings. In all the drawings, the same constituents will be given the same numeral, and the description thereof will not be repeated.

FIG. 1 is a perspective view schematically showing an appearance of an electronic part according to the present invention. As shown in FIG. 1, the electronic part 100 includes a plurality of chip parts 102 and a shielding case 104 mounted on a substrate 101. The shielding case 104 is grounded and serves to shield the plurality of chips parts 102, to block electromagnetic wave intruding thereinto from outside, and thus to protect the plurality of chip parts 102 from malfunction.

The chip parts 102 each include a ground (GND) terminal 103A and an electrode terminal 103B for supplying a voltage source, on the respective end portions thereof. The ground terminal 103A and the electrode terminal 103B are respectively connected to a ground terminal land 107A and an electrode terminal land 107B on the substrate 101.

The shielding case 104 includes an opening 105 formed on a top face thereof. The opening 105 is, for example, of a rectangular shape and of a size that permits providing a resin therethrough to secure drop strength of the connection point of the ground terminal 103A and the ground terminal land 107A, as well as the electrode terminal 103B and the electrode terminal land 107B, with respect to the respective chip parts 102 in the shielding case 104. Also, the opening 105 is provided such that, as will be described later, an edge 106 of the opening 105 becomes parallel to the ground terminal 103A of each chip part 102 under the opening edge 106.

Figure 2:
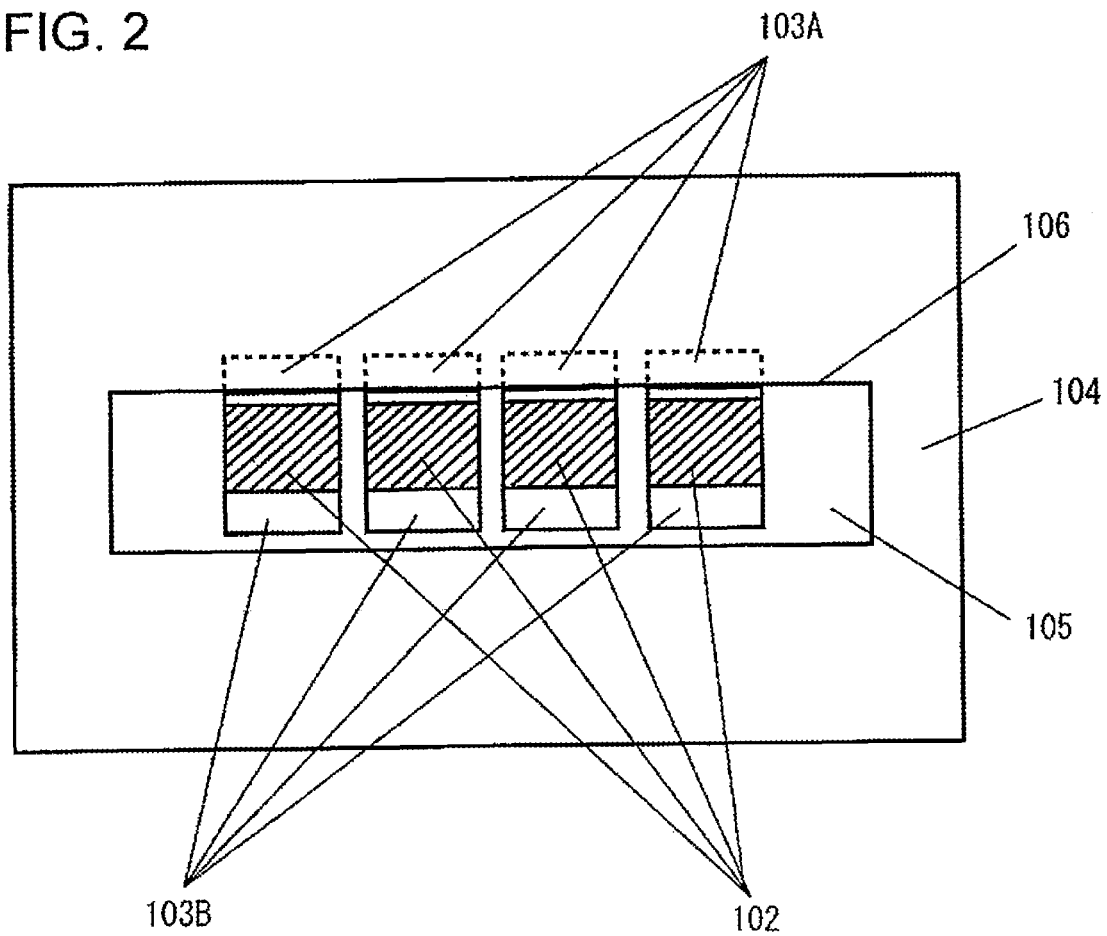
FIG. 2 is a plan view of a layout of an opening 105 of a shielding case 104 and a plurality of chip parts 102 shown in FIG. 1, from above.

FIG. 2 is a plan view of a layout of the opening 105 of the shielding case 104 and the plurality of chip parts 102 shown in FIG. 1, from above. For the sake of simplicity of the description, the shape of all the chip parts 102 is the same and, as shown in FIG. 2, the plurality of chip parts 102 is placed on the substrate 101 at regular intervals with the respective ground terminals 103A facing the same direction and aligned.

Also, the plurality of chip parts 102 is located such that, when viewed from above the shielding case 104, the respective ground terminals 103A are linearly aligned so as to overlap the shielding case 104 in parallel thereto, along a portion of the opening edge 106 constituting one side of the rectangle defined by the opening 105. Further, a portion of the plurality of chip parts 102 other than the portion overlapping with the shielding case 104 faces the opening 105 so as to be seen therethrough, and the respective electrode terminals 103B of the chip parts 102 are located so as not to overlap with the edge 106 of the opening 105 on the shielding case 104.

The foregoing description is given on the assumption that the chip parts 102 are of the same shape, and in the case where the chip parts 102 are of different lengths the opening edge 106 is formed such that a longest one of the chip parts 102 faces the opening 105, and that, when viewed from above the shielding case 104, the electrode terminal 103B of the longest chip electrode does not overlap with the shielding case 104.

FIGS. 3(a) and 3(b) are side views of the electronic part 100 shown in FIG. 1, for explaining comparison of the height of the electronic part 100, and FIGS. 4(a) and 4(b) are side views of the electronic part 100 with the opening edge 106 shown in FIG. 3 warped. Generally, in view of the risk that the opening edge 106 of the opening 105 and the electrode terminal 103B of the chip part 102 contact each other, the opening edge 106 and the electrode terminal 103B of the chip parts 102 are configured so as not to contact each other, as shown in FIG. 3(a). For example, the clearance between the opening edge 106 and the electrode terminal 103B of the chip part 102 is defined as f1, so that a clearance f1' (f1>f1'>0) can be secured between the opening edge 106 and the electrode terminal 103B of the chip part 102, even when bending force is applied to the top face of the shielding case 104 so as to warp the opening edge 106 as shown in FIG. 4(a). In this example, the height of the electronic part 100 is denoted as h1.

According to the present invention, in contrast, the clearance between the opening edge 106 and the ground terminal 103A of the chip parts 102 parallel thereto is defined as f2, as shown in FIG. 3(b). The clearance between the opening edge 106 and the ground terminal 103A in the case where the opening edge 106 is warped is defined as f2, as shown in FIG. 4(b). In the case where such bending force that can largely warp the opening edge 106 is applied to the top face of the shielding case 104, the clearance f2' becomes zero. Accordingly, although the opening edge 106 and the ground terminal 103A contact each other, the opening edge 106 and the electrode terminal 103B are kept from contacting each other even though the opening edge 106 is warped, since the chip parts 102 are not located under the opening edge 106. Also, the contact of the opening edge 106 and the ground terminal 103A is between the ground level and hence short circuit is not incurred, and consequently malfunction or abnormal heat is not provoked unlike the general case. In this case, the clearance f1 is larger than f2, and the height of the electronic part h1 is higher than h2.

The present invention allows, therefore, minimizing the clearance between the shielding case and the chip parts and thus reducing the thickness of the device, in the case where the shielding case includes an opening on the top face thereof for providing a resin therethrough to thereby secure drop strength of the terminal portion of the chip parts.

Example 1

FIGS. 5(a) and 5(b) are side views of the electronic part 100, for explaining comparison of the height of the chip parts 102 and peripheral parts shown in FIG. 1. In FIG. 5(a), bending force is applied to the top face of the shielding case 104, and the edge 106 of the opening 105 is warped so as to contact the ground terminal 103A of the chip part 102. Under such state, in the case where the peripheral parts 201 are located around the chip parts 102, the clearance between the peripheral parts 201 and the shielding case 104 thus warped is denoted as g1.

Upon comparing the height of the peripheral parts 201 and that of the chip part 102, in the case where the peripheral parts 201 and the chip part 102 are of the same height, the clearance g1 becomes small and hence the shielding case 104 and the peripheral parts 201 are prone to contact each other.

Accordingly, the peripheral parts 201 are mounted such that the height thereof becomes lower than that of the chip part 102, to thereby make the clearance g2 larger than g1 as shown in FIG. 5(b).

Such configuration minimizes the risk that the peripheral parts 201 and the shielding case 104 contact each other.

Example 2

Figure 6:
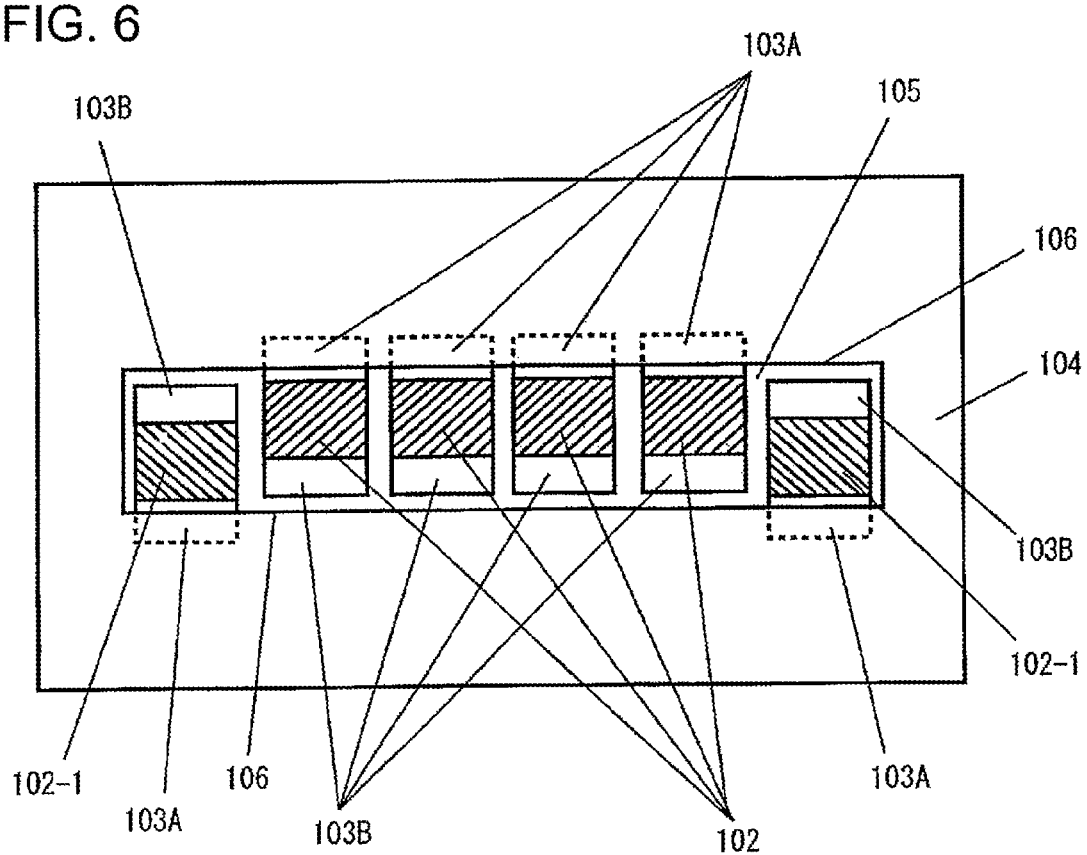
FIG. 6 is a modification of FIG. 2, and a plan view of a layout of the opening 105 of the shielding case 104 and the plurality of chip parts 102 shown in FIG. 1, from above.

FIG. 6 is a modification of FIG. 2, and a plan view of a layout of the opening 105 of the shielding case 104 and the plurality of chip parts 102 shown in FIG. 1, from above. In comparison with FIG. 2, a difference in FIG. 6 is that the ground terminal 103A of a plurality of chip parts 102-1 are linearly aligned so as to overlap a portion of the opening edge 106 opposite to the portion thereof on the side the ground terminal 103A of plurality of chip parts 102. The portion of the plurality of chip parts 102-1 other than the portion overlapping with the shielding case 104 is seen through the opening 105, and the chip parts 102-1 are located such that the respective electrode terminals 103B do not overlap with the shielding case 104, in other words such that the respective electrode terminals 103B do not contact the shielding case 104 when the opening edge 106 is warped.

The present invention allows, therefore, securing diversity in designing the layout of the plurality of chip parts, in the case where the ground terminal 103A of the plurality of chip parts 102-1 and those of the plurality of chip parts 102 cannot be linearly aligned.

Example 3

Figure 7:
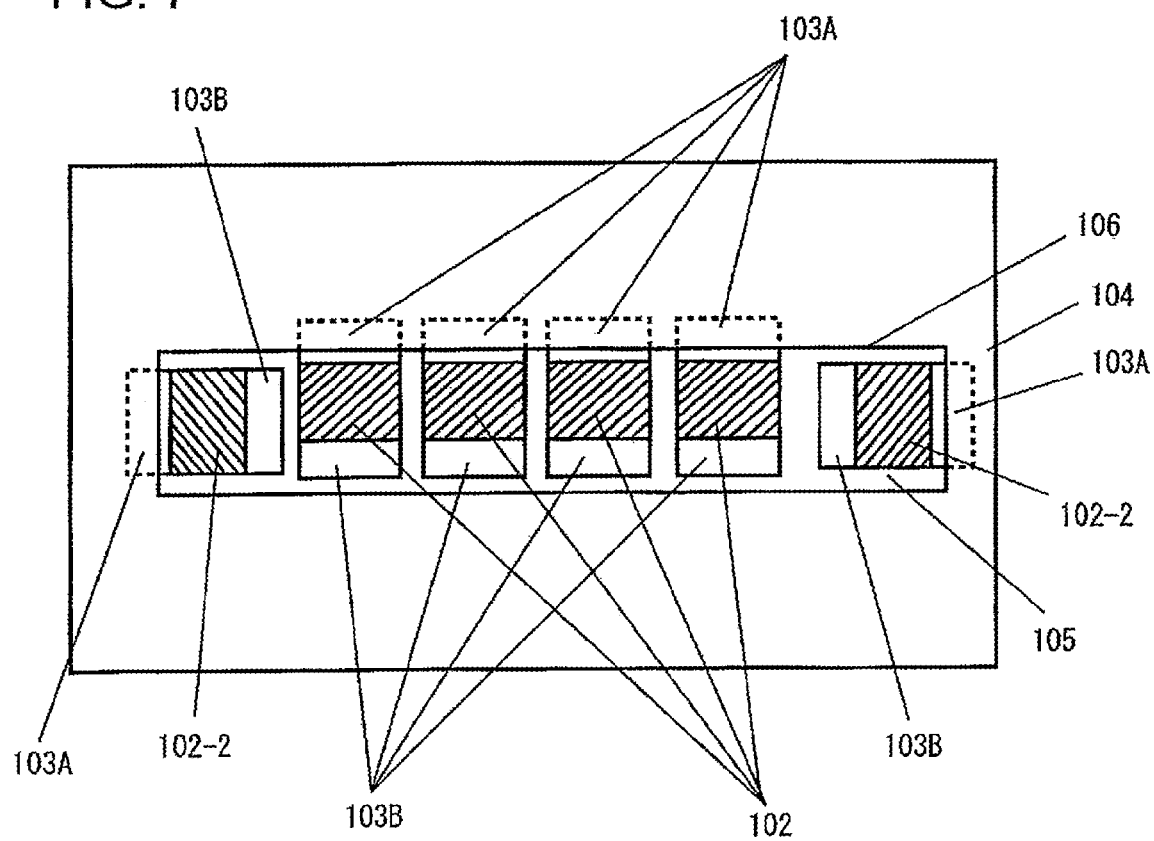
FIG. 7 is another modification of FIG. 2, and a plan view of a layout of the opening 105 of the shielding case 104 and the plurality of chip parts 102 shown in FIG. 1, from above.

FIG. 7 is another modification of FIG. 2, and a plan view of a layout of the opening 105 of the shielding case 104 and the plurality of chip parts 102 shown in FIG. 1, from above. In comparison with FIG. 2, a difference in FIG. 7 is that the respective ground terminals 103A of a plurality of chip parts 102-2 are linearly aligned so as to overlap a portion of the opening edge 106 orthogonal to the portion thereof along the plurality of chip parts 102. The portion of the plurality of chip parts 102-2 other than the portion overlapping with the shielding case 104 faces the opening 105 so as to be seen therethrough, and the chip parts 102-2 are located such that the respective electrode terminals 103B do not overlap with the shielding case 104, in other words such that the respective electrode terminals 103B do not contact the shielding case 104 when the opening edge 106 is warped.

The present invention allows, therefore, securing diversity in designing the layout of the plurality of chip parts, in the case where the ground terminal 103A of the plurality of chip parts 102-2 and those of the plurality of chip parts 102 cannot be linearly aligned.

Example 4

Figure 8:
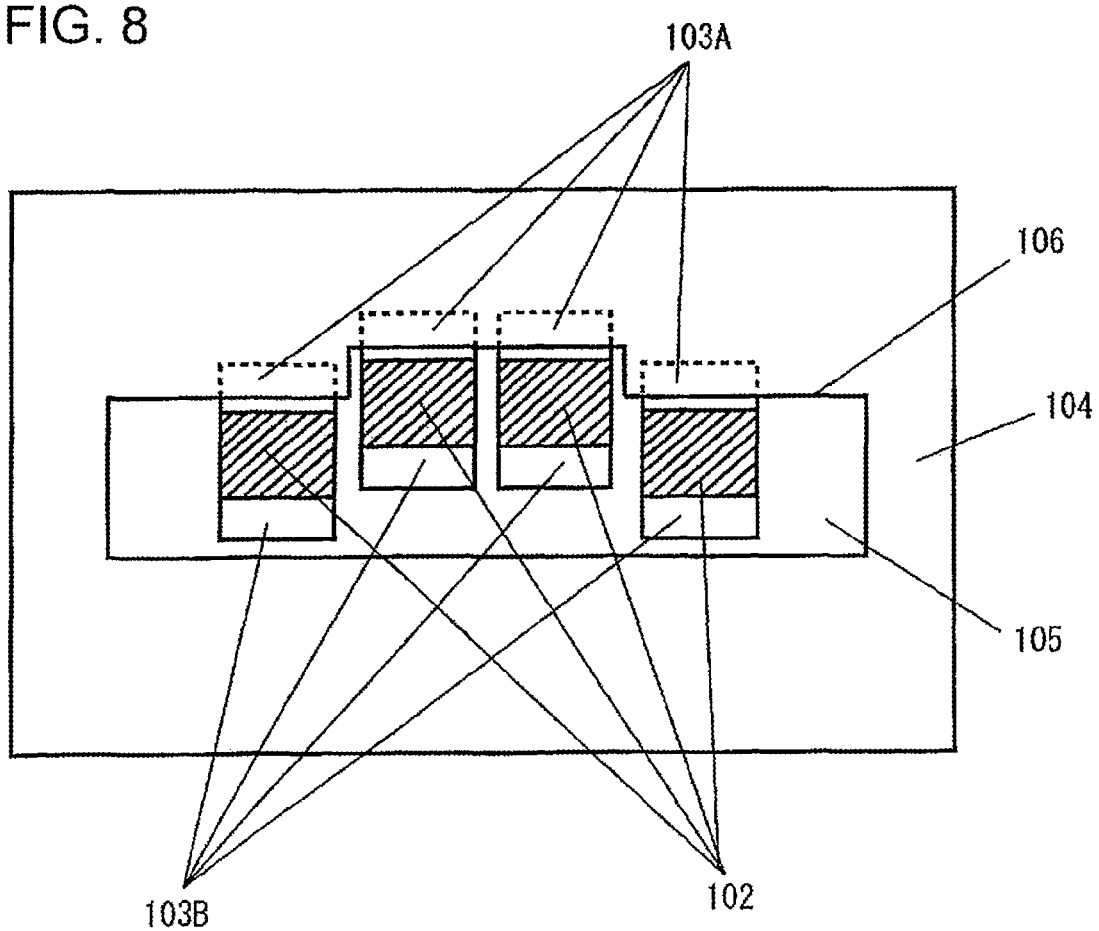
FIG. 8 is still another modification of FIG. 2, and a plan view of a layout of the opening 105 of the shielding case 104 and the plurality of chip parts 102 shown in FIG. 1, from above.

FIG. 8 is still another modification of FIG. 2, and a plan view of a layout of the opening 105 of the shielding case 104 and the plurality of chip parts 102 shown in FIG. 1, from above. In comparison with FIG. 2, a difference in FIG. 8 is that the opening edge 106 is formed in a stepped shape along the plurality of chip parts 102, and the respective ground terminals 103A of the plurality of chip parts 102 are linearly aligned so as to overlap the opening edge 106 of the stepped shape. The portion of the plurality of chip parts 102 other than the portion overlapping with the shielding case 104 faces the opening 105 so as to be seen therethrough, and the chip parts 102 are located such that the respective electrode terminals 103B do not overlap with the shielding case 104, in other words such that the respective electrode terminals 103B do not contact the shielding case 104 when the opening edge 106 is warped.

The present invention allows, therefore, securing diversity in designing the layout of the plurality of chip parts, in the case where the respective ground terminals 103A of the plurality of chip parts 102 cannot be linearly aligned.

Example 5

Figure 9:
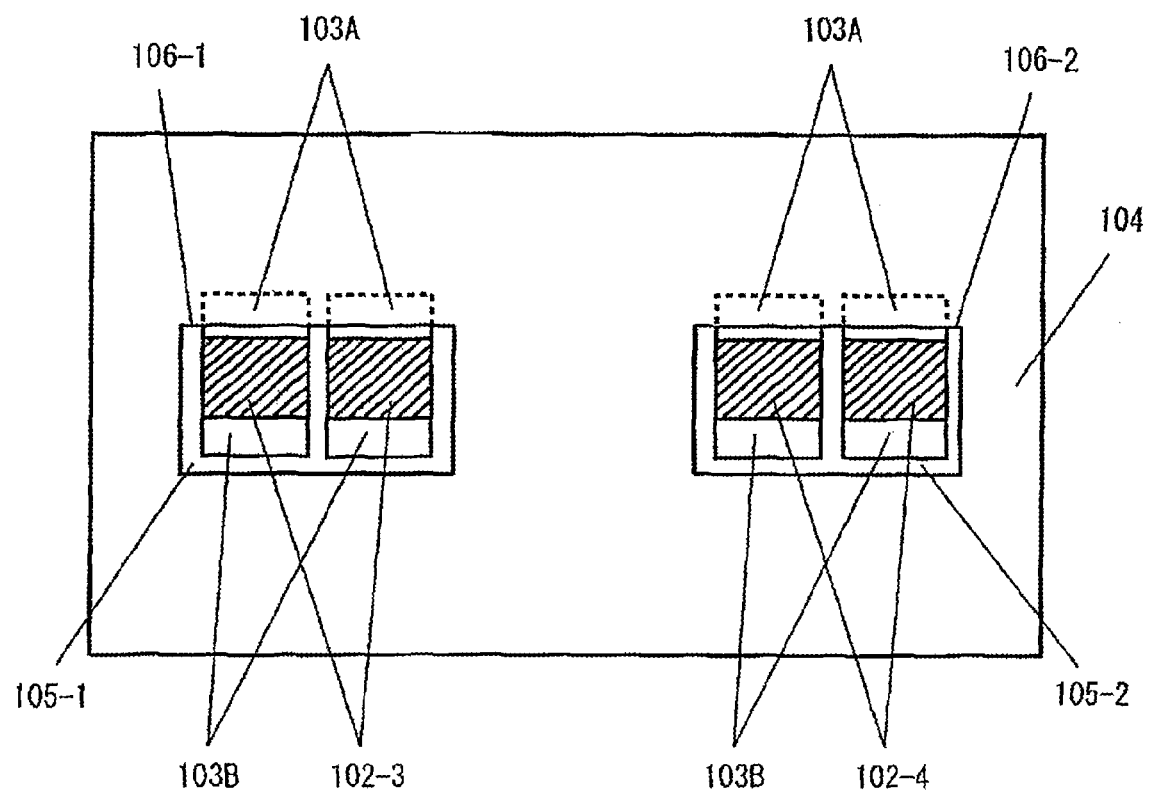
FIG. 9 is still another modification of FIG. 2, and a plan view of a layout of the opening 105 of the shielding case 104 and the plurality of chip parts 102 shown in FIG. 1, from above.

FIG. 9 is still another modification of FIG. 2, and a plan view of a layout of the opening 105 of the shielding case 104 and the plurality of chip parts 102 shown in FIG. 1, from above. In comparison with FIG. 2, a difference in FIG. 9 is that the shielding case 104 includes a plurality of openings 105-1, 105-2. Each set of the ground terminals 103A of the plurality of chip parts 102-3, 102-4 divided into a plurality of groups are linearly aligned so as to overlap with the edge 106-1, 106-2 of the opening 105-1, 105-2, respectively. The portion of the plurality of chip parts 102-3, 102-4 other than the portion overlapping with the shielding case 104 faces the opening 105-1, 105-2 so as to be seen therethrough, and the chip parts 102-3, 102-4 are located such that the respective electrode terminals 103B do not overlap with the shielding case 104, in other words such that the respective electrode terminals 103B do not contact the shielding case 104 when the opening edge 106 is warped.

The present invention allows, therefore, securing an optimal layout of the plurality of openings, in the case where the respective ground terminals 103A of the plurality of chip parts 102-3 and those of the plurality of chip parts 102-4 are separately located.

The invention claimed is:

1. An electronic part that includes parts shielded on a substrate, comprising:
    a plurality of chip parts each having on a respective end portion a ground terminal and an electrode terminal that supplies a voltage source, and located at regular intervals on said substrate with the respective ground terminals aligned, said ground terminal and said electrode terminal being electrically connected to a ground terminal land and an electrode terminal land of said substrate respectively; and
    a shielding case that shields said plurality of chip parts and includes an opening through which a resin is to be provided for securing strength of the respective electrical connection points of said ground terminal land and said electrode terminal land of said substrate with said ground terminal and said electrode terminal of said chip parts; said opening being formed such that an edge of said opening becomes parallel to said ground terminal of the respective chip parts, and such that upon being warped said opening edge and said ground terminal of the respective chip parts contact each other, and such that upon being a portion of said chip parts other than a grounding part opposes said opening without contacting said edge of said opening.

2. The electronic part according to claim 1, wherein peripheral parts lower in height than said chip parts are located around the respective chip parts.

3. The electronic part according to claim 1, wherein said opening is formed in a rectangular shape, and said chip parts is located such that said ground terminals are linearly aligned along said opening edge that constitutes one side of said rectangle.

4. The electronic part according to claim 3, wherein plurality of chip parts is located such that said plurality of ground terminals is linearly aligned along said opening edge opposing said one side of said rectangle.

5. The electronic part according to claim 3, wherein plurality of chip parts is located such that said plurality of ground terminals is linearly aligned along a side orthogonal to said opening edge constituting said one side of said rectangle.

6. The electronic part according to claim 3, wherein said opening edge constituting said one side of said rectangle is formed in a stepped shape, and said plurality of chip parts is located such that said plurality of ground terminals is linearly aligned along a respective side of said stepped portion.

7. The electronic part according to claim 1, wherein, in the case where said plurality of chip parts is separated in a plurality of groups on said substrate, said shielding case includes a plurality of openings, and said openings are formed such a respective edge thereof becomes parallel to said ground terminal of said plurality of chip parts of each group.

8. A method for arranging a shielding case and a plurality of chip parts, comprising:
    locating at regular intervals on a substrate said plurality of chip parts each having on a respective end portion a ground terminal and an electrode terminal that supplies a voltage source, such that the respective ground terminals are aligned, and electrically connecting said ground terminal and said electrode terminal to a ground terminal land and an electrode terminal land of said substrate respectively;
    forming an opening on said shielding case through which a resin is to be provided for securing strength of the respective electrical connection points of said ground terminal land and said electrode terminal land of said substrate with said ground terminal and said electrode terminal of said chip parts; and
    forming said opening such that an edge of said opening becomes parallel to said ground terminal of the respective chip parts, and such that upon being warped said opening edge and said ground terminal of the respective chip parts contact each other, and such that upon being a portion of said chip parts other than a grounding part opposes said opening without contacting said edge of said opening.

* * * * *